United States Patent
Han

(10) Patent No.: US 7,405,097 B2
(45) Date of Patent: Jul. 29, 2008

(54) CMOS IMAGE SENSOR AND METHOD FOR MANUFACTURING THE SAME

(75) Inventor: Chang Hun Han, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 192 days.

(21) Appl. No.: 11/319,586

(22) Filed: Dec. 29, 2005

(65) Prior Publication Data
US 2006/0145214 A1    Jul. 6, 2006

(30) Foreign Application Priority Data
Dec. 30, 2004    (KR) .................... 10-2004-0116423

(51) Int. Cl.
*H01L 21/00*    (2006.01)
(52) U.S. Cl. .............................. 438/48; 438/60; 438/7; 257/E27
(58) Field of Classification Search ............. 438/59–60, 438/69–76, 48, 7, E27
See application file for complete search history.

(56) References Cited

U.S. PATENT DOCUMENTS 6,489,643 B1 * 12/2002 Lee et al. .................... 257/292
7,226,803 B2 *  6/2007 Mouli et al. .................. 438/59

FOREIGN PATENT DOCUMENTS

JP    62-269355    11/1987
KR    10-2002-0045864 A    6/2002

* cited by examiner

*Primary Examiner*—Cuong Q Nguyen
(74) *Attorney, Agent, or Firm*—McKenna Long Aldridge LLP

(57) ABSTRACT

A CMOS image sensor and a method for manufacturing the same are disclosed, in which a blue photodiode is imparted with a greater thickness to improve sensitivity of blue light. The blue photodiode of a CMOS image sensor includes a first lightly doped P-type epitaxial layer formed on a heavily doped P-type semiconductor substrate; a gate electrode of a transfer transistor formed on the first epitaxial layer; a first N-type blue photodiode region formed on the first epitaxial layer; and a second N-type blue photodiode region formed on the first epitaxial layer corresponding to the first blue photodiode region.

4 Claims, 10 Drawing Sheets

CMOS IMAGE SENSOR AND METHOD FOR MANUFACTURING THE SAME

This application claims the benefit of Korean Patent Application No. 10-2004-0116423, filed on Dec. 30, 2004, which is hereby incorporated by reference for all purposes as if fully set forth herein.

BACKGROUND OF THE INVENTION

1. Field of the Invention

The present invention relates to complementary metal-oxide-semiconductor (CMOS) image sensors, and more particularly, to a blue photodiode of a CMOS image sensor and a method for manufacturing the same, in which the blue photodiode is formed to be higher and wider than a semiconductor substrate to improve sensitivity of blue light.

2. Discussion of the Related Art

An image sensor is a semiconductor device that converts optical images to electrical signals. The image sensor is classified into a charge-coupled device (CCD) and a CMOS image sensor. The CCD stores charge carriers in MOS capacitors and transfers the charge carriers to the MOS capacitors. The MOS capacitors are approximate to one another. The CMOS image sensor employs a switching mode that sequentially detects outputs of unit pixels using MOS transistors by forming the MOS transistors to correspond to the number of the unit pixels using CMOS technology that uses a control circuit and a signal processing circuit as peripheral circuits.

The CMOS image sensor that converts data of an object into electrical signals includes signal processing chips having photodiodes. Each of the signal processing chips includes an amplifier, an analog-to-digital converter, an internal voltage generator, a timing generator, and a digital logic. The CMOS image sensor is economical in view of space, power consumption, and cost. The manufacture of the CCD requires technical process steps. However, a CMOS image sensor can be manufactured in mass production by a simple etching process of a silicon wafer. Thus, it is cheaper to manufacture a CMOS image sensor than to manufacture the CCD. Also, an advantage of the CMOS image sensor is its packing density.

To display images, the CMOS image sensor sequentially detects signals in a switching mode by forming a photodiode and a transistor in a unit pixel. Also, since the CMOS image sensor uses CMOS technology, low power consumption is required. The number of masks for a CMOS image sensor is fewer by twenty fewer than the thirty to forty masks required for the CCD image sensor. In this way, in the CMOS image sensor, process steps are simplified and various signal processing circuits can be integrated in one chip. Therefore, the CMOS image sensor has received much attention as an image sensor for the next generation.

FIGS. 1 and 2 show a unit circuit of a related art CMOS image sensor.

As shown in FIG. 1, a photodiode PD for generating optical charges using received light, a transfer transistor 101 for transferring the optical charges generated by the photodiode to a floating diffusion region 102 by applying a signal Tx to its gate, a reset transistor 103 for resetting the floating diffusion region 102 by applying a signal Rx to its gate to set the potential of the floating diffusion region 102 at a desired value and for discharging the floating diffusion region 102, a drive transistor 104 serving as a source-follower buffer amplifier by applying a signal Dx to its gate, a selection transistor 105 for addressing and applying a signal Sx to its gate, and a load transistor 106 for providing an output signal ($V_b$) to be read out from the unit pixel. Power ($V_{DD}$) is applied.

As shown in FIG. 2, a P-type epitaxial layer 111 is grown on a heavily doped P-type substrate 110, and a lightly doped N-type photodiode region 113, a P-type well 114 and a device isolation film (FOX) 112 are formed in the epitaxial layer 111. The transfer transistor 101 and the reset transistor 103 are formed on the epitaxial layer 111 between the photodiode region 113 and the P-type well 114. The drive transistor 104 and the selection transistor 105 are formed on the P-type well 114. The floating diffusion region 102 is formed on the epitaxial layer 111 between the transfer transistor 101 and the reset transistor 103. A P-type diffusion layer 115 is formed in the lightly doped N-type photodiode region 113 below the surface of the lightly doped P-type epitaxial layer 111 and is doped more lightly than the epitaxial layer.

Referring to FIG. 3, illustrating a blue photodiode portion of the above CMOS image sensor, the device isolation film 112 is formed on the semiconductor substrate 110 in which the lightly doped P-type epitaxial layer 111 is formed. The device isolation film 112 serves to isolate an active region including the lightly doped N-type photodiode region 113. The transfer transistor 101 including a gate electrode is formed on the epitaxial layer 111. A first interlayer dielectric film 116 is formed on the epitaxial layer 111 including the transfer transistor 101. The first interlayer dielectric film 116 is selectively etched to form a via hole 117. Then, a first metal layer (not shown) is deposited and selectively etched to form a first metal layer pattern 118. A second interlayer dielectric film 119 is formed on the first interlayer dielectric film 116 including the first metal layer pattern 118. A second metal layer (not shown) is formed on the second interlayer dielectric film 119 and then selectively etched to form a second metal layer pattern 120. A third interlayer dielectric film 121 including the second metal layer pattern 120 is formed on the second interlayer dielectric film 119. A device passivation layer 122 is formed on the third interlayer dielectric film 121. A blue color filter array element 123 is formed on the device passivation layer 122 as part of a color filter array. The color filter array includes a red filter pattern, a blue filter pattern, and a green filter pattern. A planarization layer 124 is formed on the blue color filter array element 123. Finally, a microlens 125 is formed on the planarization layer 124 and corresponds to the blue color filter array element 123.

In the related art CMOS image sensor manufactured above, however, the blue photodiode may fail to sense shorter wavelengths because blue light in a general pixel structure has a penetration depth of 0.3 μm. By contrast, red light has a penetration depth of 10 μm. Therefore, the desired display of the respective colors (i.e., red, green, and blue) at a ratio of 1:1 is impeded, thereby degrading color reproduction quality.

SUMMARY OF THE INVENTION

Accordingly, the present invention is directed to a blue photodiode of a CMOS image sensor and a method for manufacturing the same that substantially obviates one or more problems due to limitations and disadvantages of the related art.

An advantage of the present invention is to provide a blue photodiode of a CMOS image sensor and a method for manufacturing the same, in which the blue photodiode is imparted with a greater thickness, to improve sensitivity of blue light.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the invention, as embodied and broadly described herein, there is provided a CMOS image sensor comprising a semiconductor substrate; a gate electrode formed on the semiconductor substrate; a first blue photodiode region formed in the semiconductor substrate; and a second blue photodiode region formed on the first blue photodiode region.

In another aspect of the present invention, there is provided a CMOS image sensor comprising a first lightly doped P-type epitaxial layer formed on a heavily doped P-type semiconductor substrate; a gate electrode of a transfer transistor formed on the first epitaxial layer; a first N-type blue photodiode region formed on the first epitaxial layer; and a second N-type blue photodiode region formed on the first epitaxial layer corresponding to the first blue photodiode region.

In another aspect of the present invention, there is provided a method for manufacturing a CMOS image sensor comprising forming a gate electrode on a semiconductor substrate; forming a first blue photodiode region in the semiconductor substrate; and forming a second blue photodiode region on the first blue photodiode region.

In another aspect of the present invention, there is provided a method for manufacturing a CMOS image sensor comprising forming a first lightly doped P-type epitaxial layer on a heavily doped P-type semiconductor substrate; forming a gate electrode on the first epitaxial layer; forming a first N-type blue photodiode region on the first epitaxial layer; forming a second N-type epitaxial layer on the first epitaxial layer including the first blue photodiode region; and forming a second N-type blue photodiode region by patterning the second epitaxial layer to remain only on the first blue photodiode region.

In another aspect of the present invention, there is provided a method for manufacturing a CMOS image sensor comprising forming a first lightly doped P-type epitaxial layer on a heavily doped P-type semiconductor substrate; forming a gate electrode on the first epitaxial layer; forming a first N-type blue photodiode region on the first epitaxial layer; forming a dielectric film on the first epitaxial layer including the first blue photodiode region; patterning the dielectric film to expose the first blue photodiode region; and forming a second blue photodiode region by forming a second N-type epitaxial layer on the first epitaxial layer corresponding to the first blue photodiode region.

According to the present invention, the second blue photodiode region has a thickness of 300 Å to 5000 Å.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention. In the drawings.

DETAILED DESCRIPTION OF THE INVENTION

Reference will now be made in detail to embodiments of the present invention, examples of which are illustrated in the accompanying drawings. Wherever possible, like reference designations will be used throughout the drawings to refer to the same or similar parts.

Figure 1:
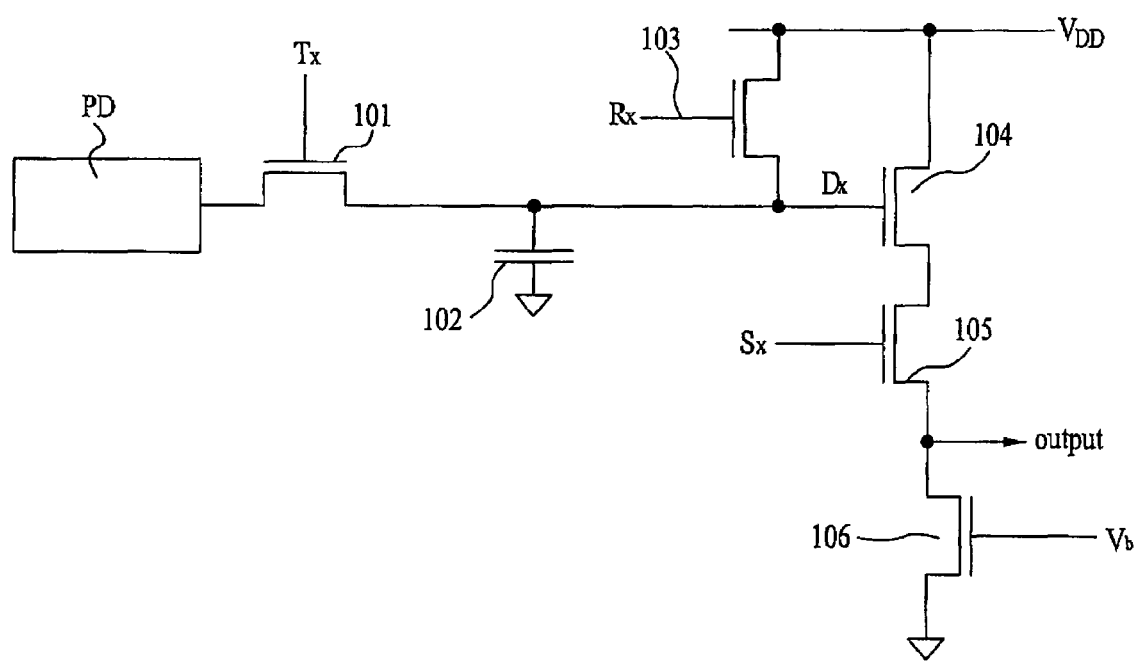
FIG. 1 is a plan view of a unit circuit of a related art CMOS image sensor.
Figure 2:
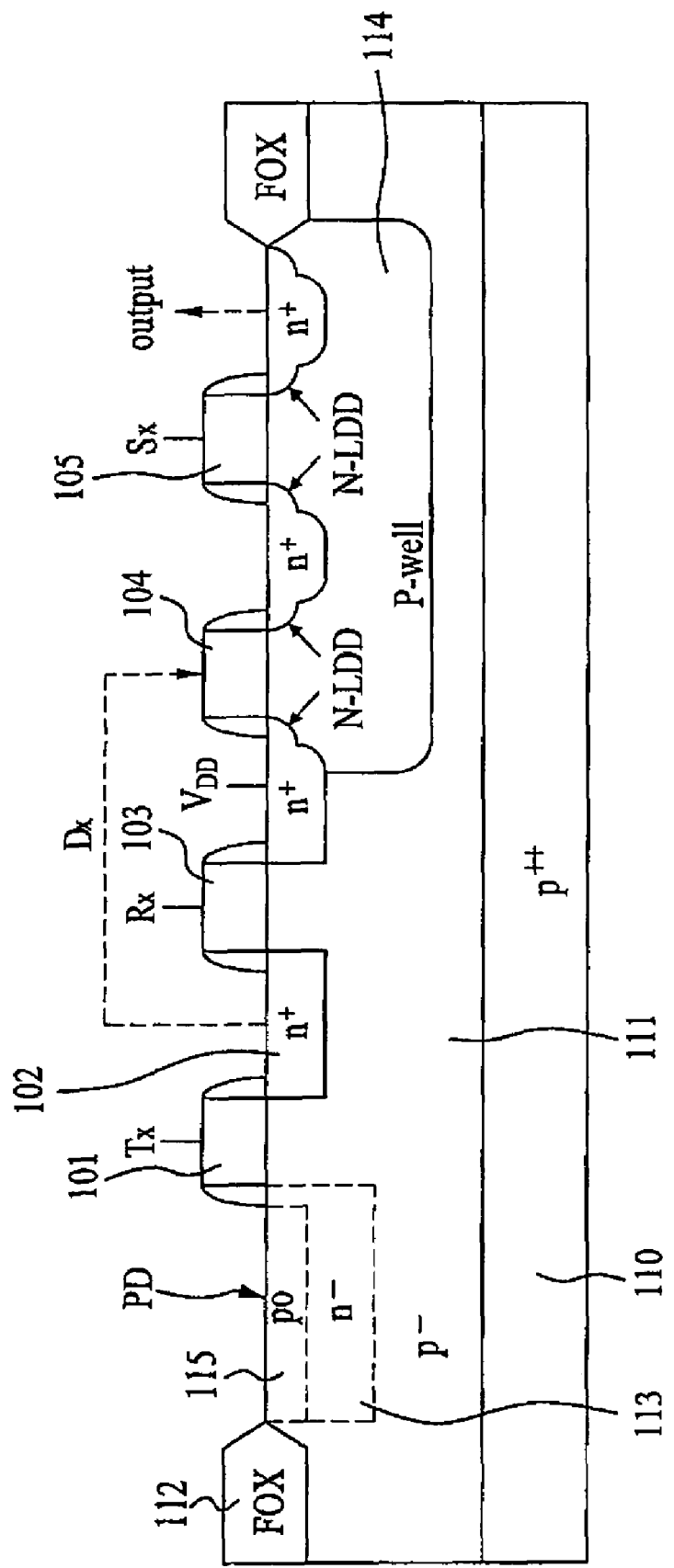
FIG. 2 is a sectional view of the CMOS image sensor shown in FIG. 1.
Figure 3:
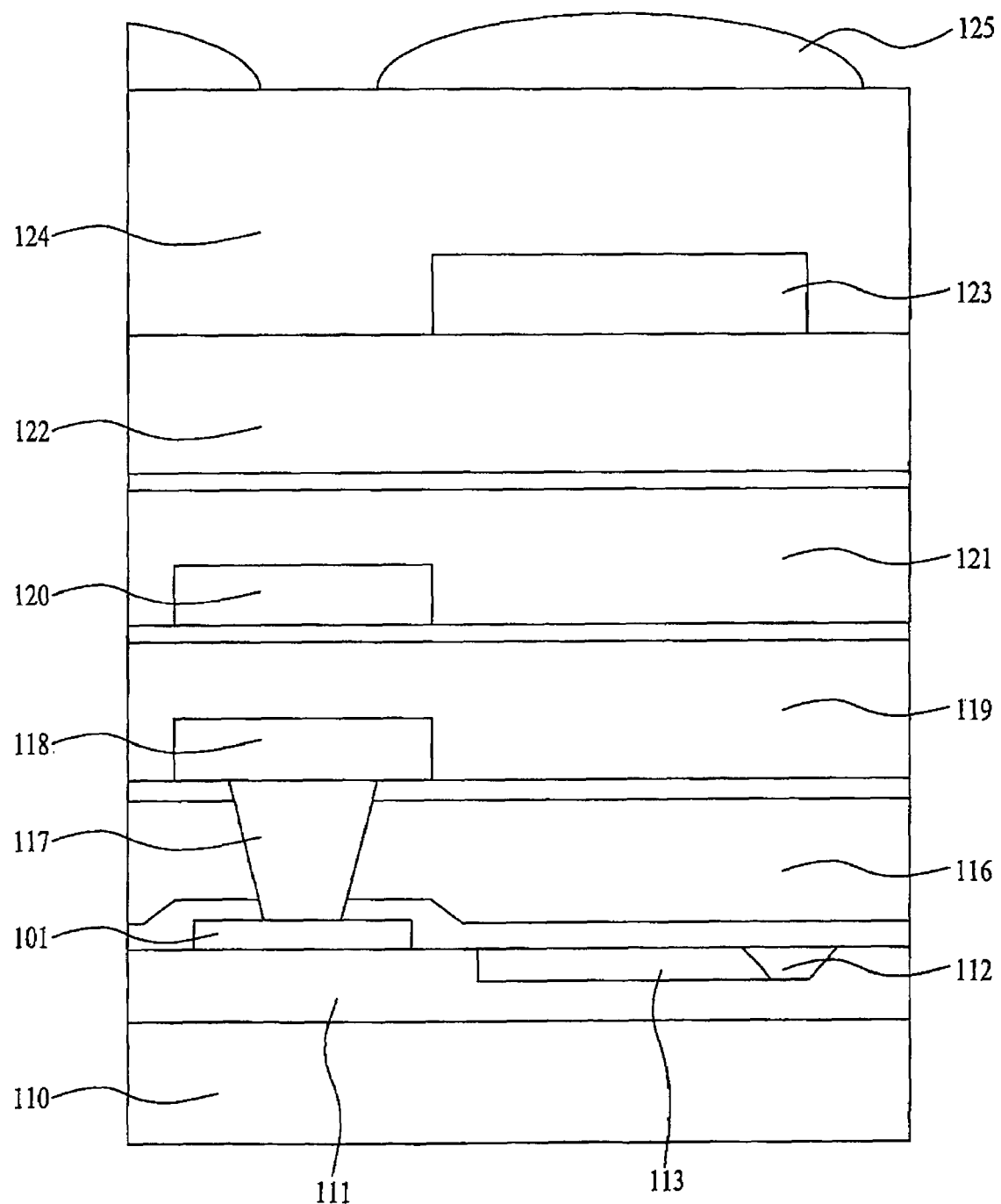
FIG. 3 is a sectional view of a blue photodiode portion of a CMOS image sensor according to a related art.
Figure 4:
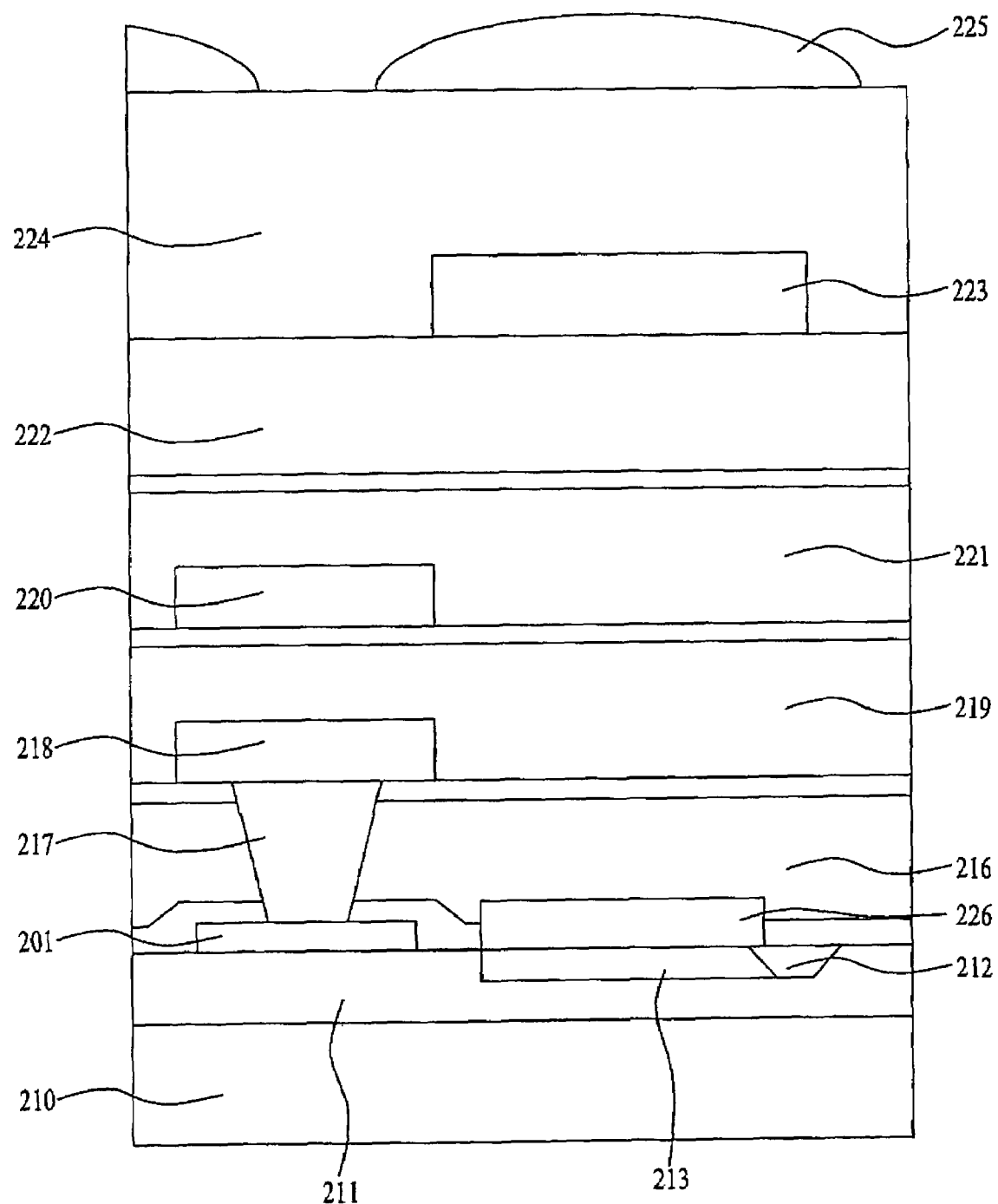
FIG. 4 is a sectional view of a blue photodiode portion of a CMOS image sensor according to the present invention.

Referring to FIG. 4, illustrating a blue photodiode portion of a CMOS image sensor according to the present invention, a device isolation film 212 is formed on a semiconductor substrate 210 in which a first lightly doped P-type epitaxial layer 211 is formed. The device isolation film 212 serves to isolate an active region including a lightly doped N-type blue photodiode region 213. A second lightly doped N-type epitaxial layer 226 is formed on the photodiode region 213.

A transfer transistor 201 including a gate electrode is formed on the first epitaxial layer 211. A first interlayer dielectric film 216 is formed on the first epitaxial layer 211 including the transfer transistor 201. The first interlayer dielectric film 216 is selectively etched to form a via hole 217. Then, a first metal layer (not shown) is deposited and selectively etched to form a first metal layer pattern 218. A second interlayer dielectric film 219 is formed on the first interlayer dielectric film 216 including the first metal layer pattern 218. A second metal layer (not shown) is formed on the second interlayer dielectric film 219 and then selectively etched to form a second metal layer pattern 220. A third interlayer dielectric film 221 including the second metal layer pattern 220 is formed on the second interlayer dielectric film 219. A device passivation layer 222 is formed on the third interlayer dielectric film 221. A blue color filter array element 223 is formed on the device passivation layer 222 as part of a color filter array. The color filter array includes a red filter pattern, a blue filter pattern, and a green filter pattern. A planarization layer 224 is formed on the blue color filter array element 223. Finally, a microlens 225 is formed on the planarization layer 224 to correspond to the blue color filter array element 223.

FIGS. 5-9 respectively illustrate sequential process steps of a method for fabricating a CMOS image sensor according to an embodiment of the present invention.

Figure 5:
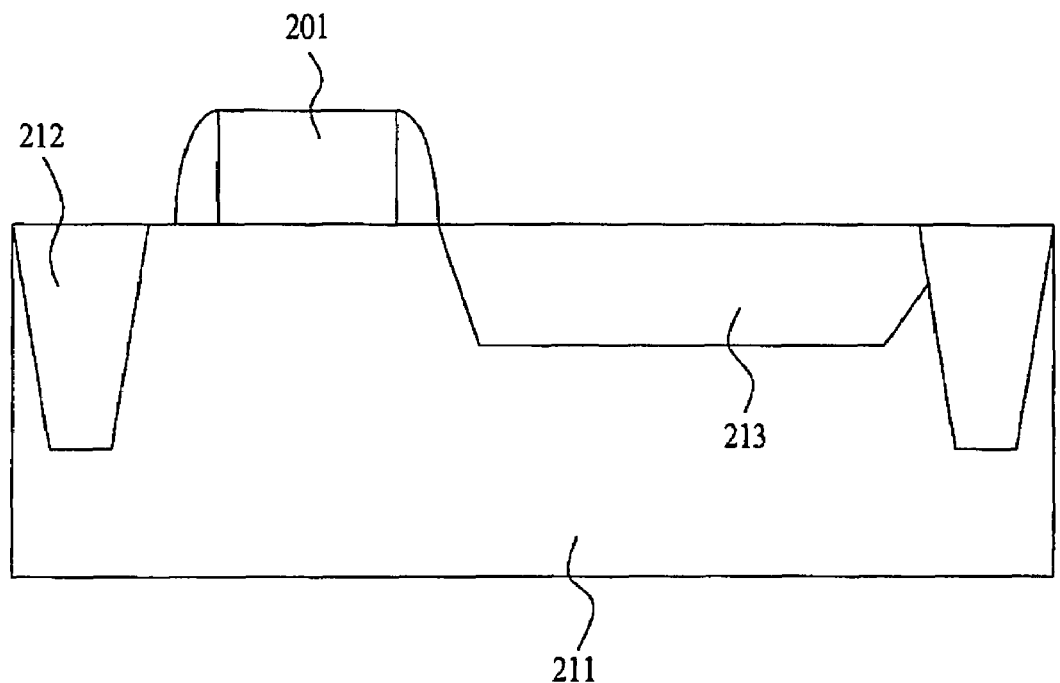
FIGS. 5-9 are sectional views of a blue photodiode of a CMOS image sensor fabricated according to an embodiment of the method of the present invention.

As shown in FIG. 5, the device isolation film 212 is formed in the semiconductor substrate (not shown) on which the first lightly doped P-type epitaxial layer 211 is formed. The device isolation film 212 serves to isolate devices from each other. The transfer transistor 201 including a gate electrode and the lightly doped N-type blue photodiode region 213 are formed in the first epitaxial layer 211.

Figure 6:
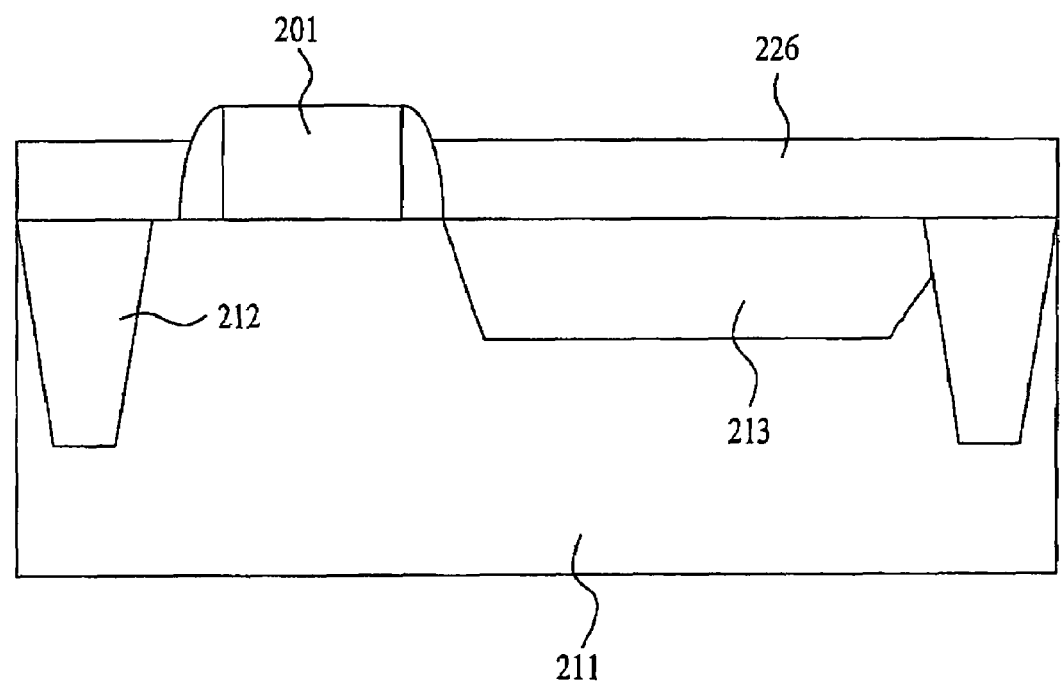

As shown in FIG. 6, the second lightly doped N-type epitaxial layer 226 is grown to a thickness of 300 Å to 5000 Å on the first epitaxial layer 211 including the blue photodiode region 213. There is no growth of the second epitaxial layer 226 on the transfer transistor 201.

Figure 7:
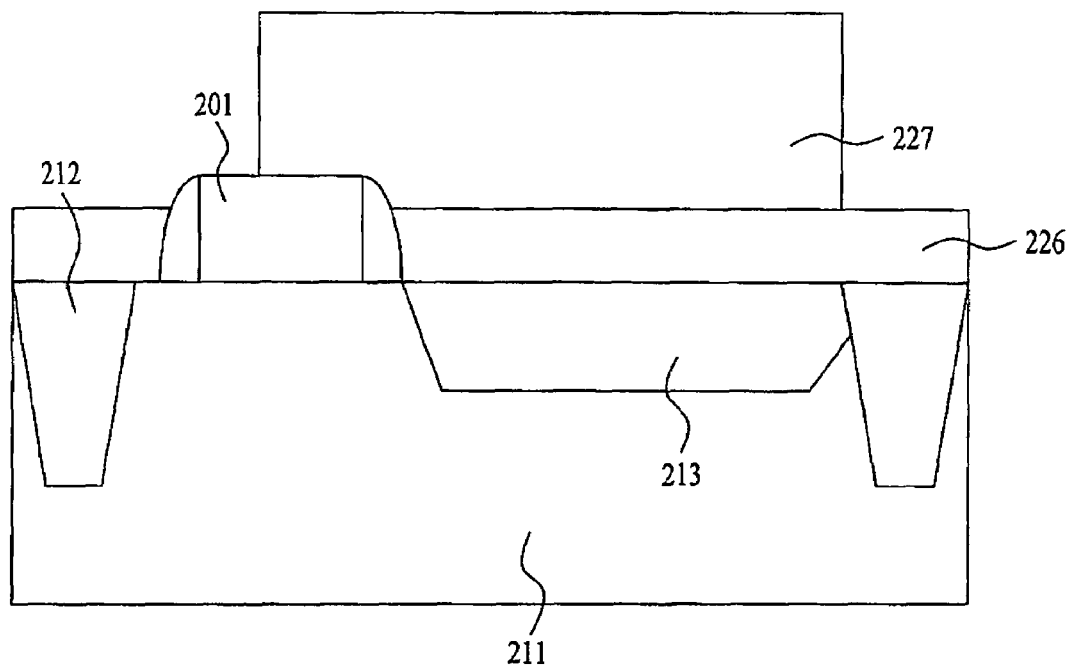
Figure 8:
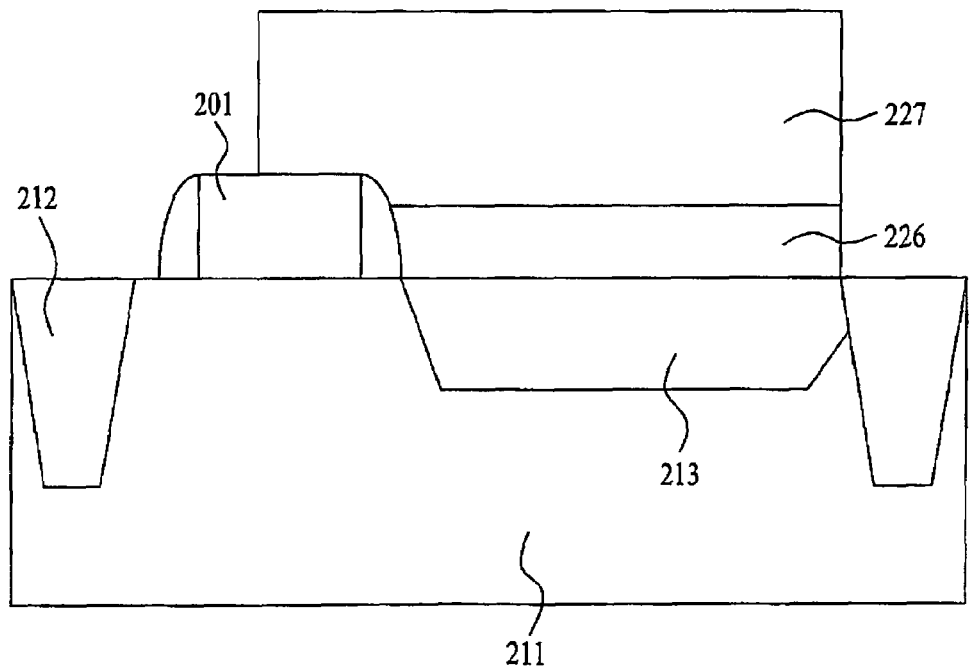
Figure 9:
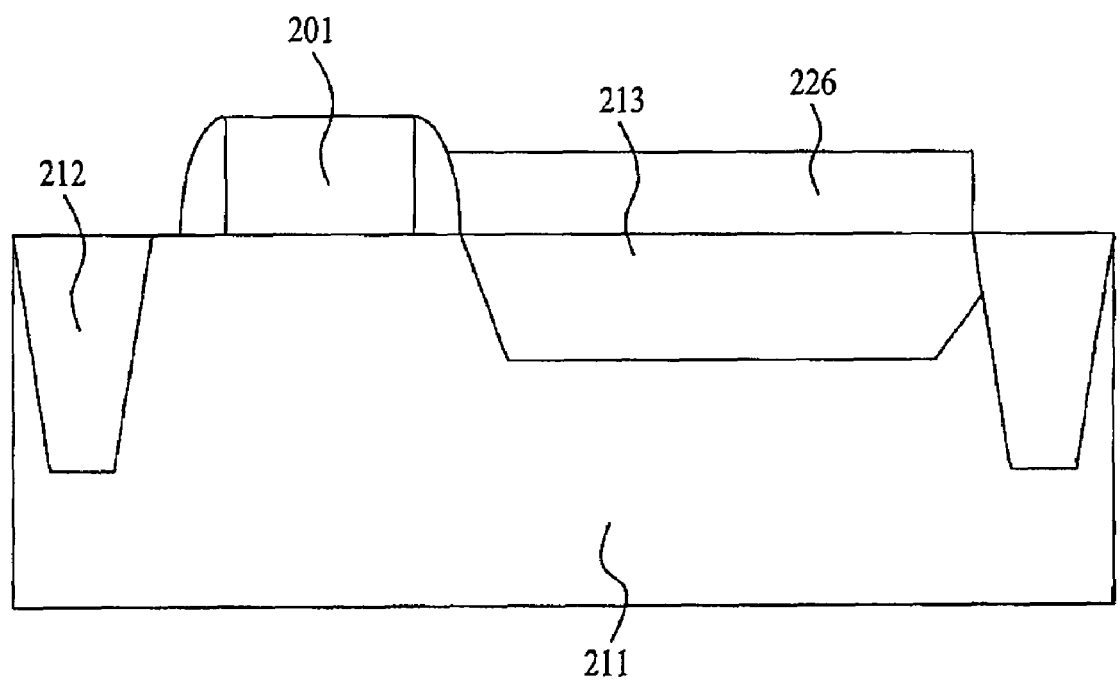

As shown in FIG. 7, a photoresist film pattern 227 is formed on the second epitaxial layer 226 corresponding to the blue photodiode region 213. As shown in FIG. 8, the second epitaxial layer 226 is etched using the photoresist film pattern 227 as a mask such that the second epitaxial layer 226 remains only on the first epitaxial layer 211 corresponding to the blue photodiode region 213. As shown in FIG. 9, the photoresist film pattern 227 is removed.

FIGS. 10-13 respectively illustrate sequential process steps of a method for fabricating a CMOS image sensor according to another embodiment of the present invention.

Figure 10:
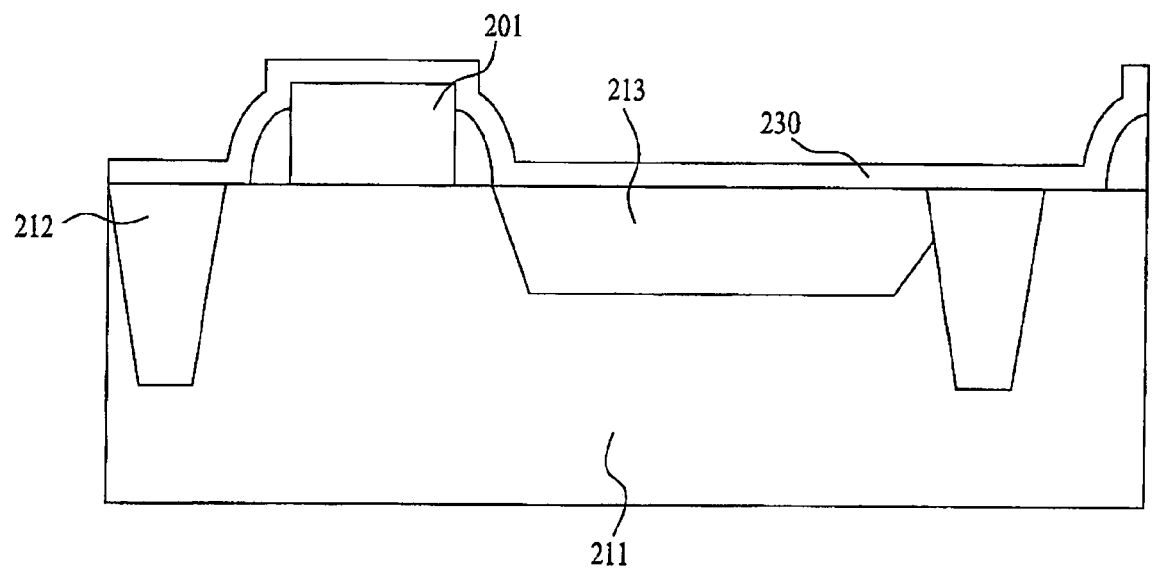
FIGS. 10-13 are sectional views of a blue photodiode of a CMOS image sensor fabricated according to another embodiment of the method of the present invention.

As shown in FIG. 10, the device isolation film 212 is formed in the semiconductor substrate (not shown) in which the first lightly doped P-type epitaxial layer 211 is formed. The device isolation film 212 serves to isolate devices from each other. The transfer transistor 201, including a gate electrode and the lightly doped N-type blue photodiode region 213 are formed on the first epitaxial layer 211. An interlayer dielectric film 230 is formed on the first epitaxial layer 211 including the transfer transistor 201.

Figure 11:
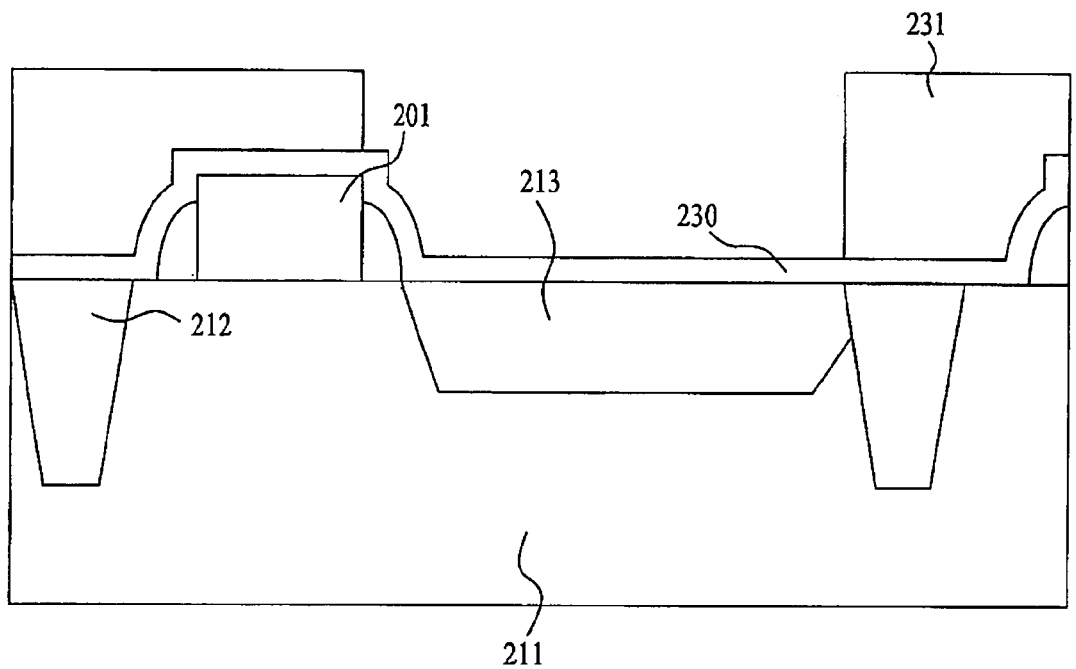

As shown in FIG. 11, a photoresist film pattern 231 that exposes an upper region corresponding to the blue photodiode region 213 is formed by depositing a photoresist layer on the interlayer dielectric film 230 and patterning the deposited photoresist layer by photolithography including exposure and development steps.

Figure 12:
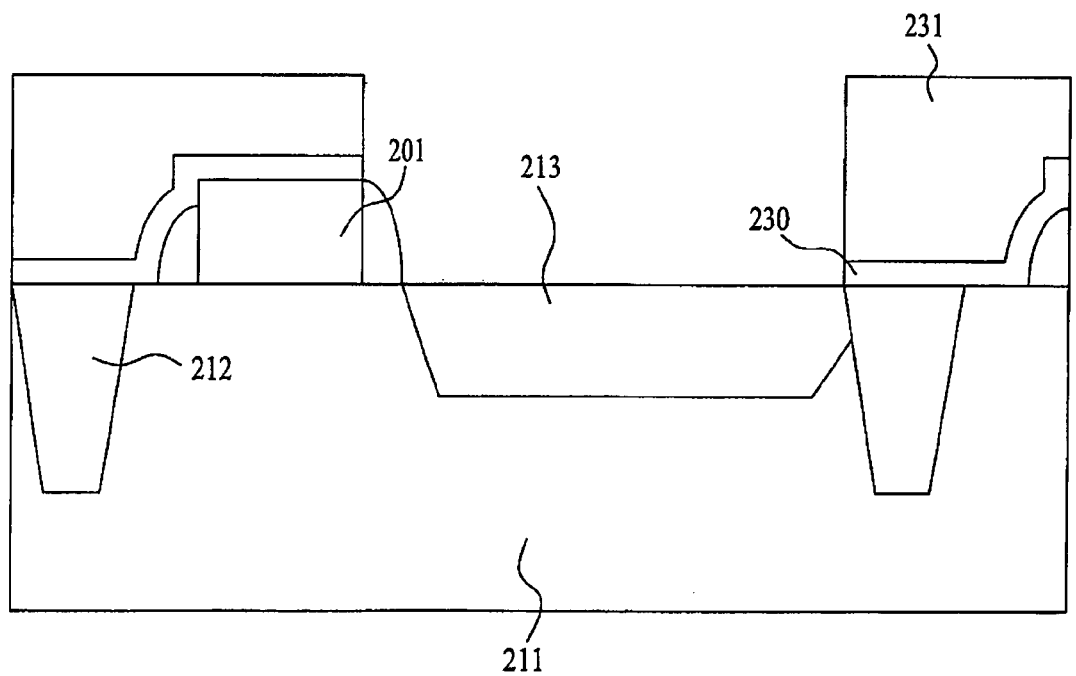

As shown in FIG. 12, the interlayer dielectric film 230 is etched using the photoresist film pattern 231 as a mask, to thereby remove the exposed portion.

Figure 13:
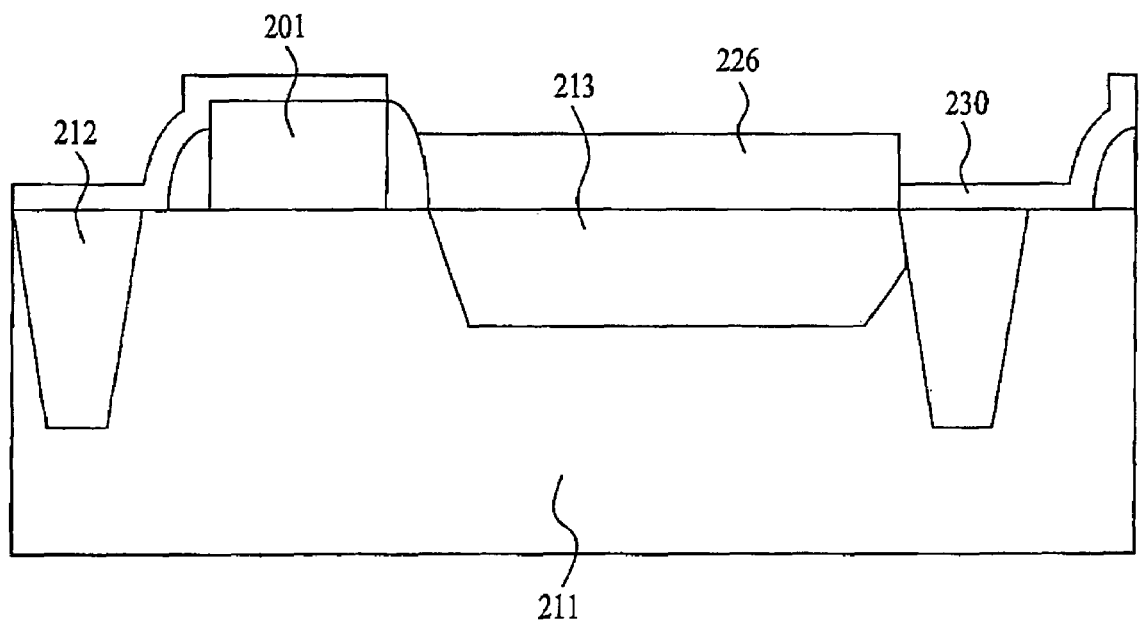

As shown in FIG. 13, a second lightly doped N-type epitaxial layer 226 is grown. There is no growth of the second epitaxial layer 226 where the interlayer dielectric film 230 is formed.

In the CMOS image sensor manufactured above, sensitivity of blue light is improved, and the overall thickness of the effective blue photodiode region is increased by using a portion above the device isolation film as an area or depth sensitive to blue light. Since the lightly doped N-type epitaxial layer that receives the blue light is imparted with a greater thickness, which extends above the surface of the semiconductor substrate, the depth of a focus can be reduced to more effectively collect the light and thereby improve color reproduction characteristics.

It will be apparent to those skilled in the art that various modifications and variation can be made in the present invention without departing from the spirit or scope of the invention. Thus, it is intended that the present invention cover the modifications and variations of the invention provided they come within the scope of the appended claims and their equivalents.

What is claimed is:

1. A method for manufacturing a CMOS image sensor, comprising:
    forming a first lightly doped P-type epitaxial layer on a heavily doped P-type semiconductor substrate;
    forming a gate electrode on the first epitaxial layer;
    forming a first N-type blue photodiode region on the first epitaxial layer;
    forming a second N-type epitaxial layer on the first epitaxial layer including the first blue photodiode region; and
    forming a second N-type blue photodiode region by patterning the second epitaxial layer to remain only on the first blue photodiode region.

2. The method of claim 1, wherein the second blue photodiode region is formed to a thickness of 300 Å to 5000 Å.

3. A method for manufacturing a CMOS image sensor, comprising:
    forming a first lightly doped P-type epitaxial layer on a heavily doped P-type semiconductor substrate;
    forming a gate electrode on the first epitaxial layer;
    forming a first N-type blue photodiode region on the first epitaxial layer;
    forming a dielectric film on the first epitaxial layer including the first blue photodiode region;
    patterning the dielectric film to expose the first blue photodiode region; and
    forming a second blue photodiode region by forming a second N-type epitaxial layer on the first epitaxial layer corresponding to the first blue photodiode region.

4. The method of claim 3, wherein the second blue photodiode region is formed to a thickness of 300 Å to 5000 Å.

* * * * *